United States Patent [19]
Chandrasekhar et al.

[11] Patent Number: 5,625,206
[45] Date of Patent: Apr. 29, 1997

[54] HIGH-SPEED DOUBLE-HETEROSTRUCTURE BIPOLAR TRANSISTOR DEVICES

[75] Inventors: S. Chandrasekhar, Matawan; Andrew G. Dentai, Atlantic Highlands, both of N.J.; Yasuyuki Miyamoto, Nagareyama, Japan

[73] Assignee: Lucent Technologies Inc., Murray Hill, N.J.

[21] Appl. No.: 657,255

[22] Filed: Jun. 3, 1996

[51] Int. Cl.[6] ................................. H01L 29/201
[52] U.S. Cl. ............... 257/198; 257/197; 257/623; 257/626; 257/586; 257/593
[58] Field of Search ............................ 257/197, 198, 257/623, 626, 586, 593

[56] References Cited

U.S. PATENT DOCUMENTS

| 5,070,028 | 12/1991 | Tews et al. | 437/22 |
| 5,206,524 | 4/1993 | Chen et al. | 257/29 |
| 5,345,097 | 9/1994 | Nakagawa | 257/198 |
| 5,445,976 | 8/1995 | Henderson et al. | 437/31 |
| 5,525,818 | 6/1996 | Hill | 257/197 |

Primary Examiner—Jerome Jackson
Assistant Examiner—John Guay

[57] ABSTRACT

The total base-collector capacitance of a double-heterostructure bipolar transistor device is reduced by removing semiconductor material from the extrinsic regions and replacing the removed material with a relatively-low-dielectric-constant material. The base-collector capacitance is further reduced by using a composite subcollector structure that permits the extrinsic regions to be made thicker than the intrinsic region of the device.

5 Claims, 6 Drawing Sheets

HIGH-SPEED DOUBLE-HETEROSTRUCTURE BIPOLAR TRANSISTOR DEVICES

BACKGROUND OF THE INVENTION

This invention relates to compound-semiconductor integrated-circuit (IC) devices and, more particularly, to high-speed double-heterostructure bipolar transistor (DHBT) devices made in IC form.

DHBT devices are well known and have been proposed for use in a wide variety of important practical applications. Thus, for example, DHBT devices are considered attractive candidates for inclusion in high-speed optical communication and processing systems. In such systems, DHBT devices are well suited to be integrated with optical and/or opto-electronic devices.

It is also well known that the high-speed operation of a DHBT device is limited by its base-collector capacitance. And it is further known that a large component of the base-collector capacitance originates in the so-called extrinsic base region of the device.

Straightforward attempts to reduce the base-collector capacitance of a DHBT device by, for example, simply reducing the extrinsic base area have not been satisfactory. This is so because reducing the extrinsic base area toward the minimum value permitted by the practical necessity to be able to form electrical contacts on that area increases the base resistance of the device. In turn, increasing the base resistance degrades the direct-current and microwave characteristics of the device.

The base-collector capacitance of a DHBT device can also be reduced by simply increasing the thickness of the semiconductor material below the base region. But this also increases the transit time for carriers in the intrinsic region of the device, whereby the frequency response of the device is degraded.

Accordingly, efforts have continued by workers skilled in the art aimed at attempting to devise effective ways of improving the speed properties of a DHBT device by reducing its base-collector capacitance. In particular, these efforts have been focussed on trying to reduce the base-collector capacitance in the extrinsic base region without deleteriously affecting other properties of the device. It was recognized that these efforts, if successful, could increase the speed of operation of high-performance DHBT devices (as characterized by the unity current-gain cutoff frequency and the maximum oscillation frequency) and thereby increase the liklihood that such devices would be used as components in a wide array of very-high-speed applications.

SUMMARY OF THE INVENTION

In accordance with the principles of the present invention, the total base-collector capacitance of a DHBT device is reduced by replacing semiconductor material below the extrinsic base region of the device with a material whose dielectric constant is lower than that of the semiconductor. The reduction in base-collector capacitance is further enhanced by using a composite subcollector structure which allows the thickness below the extrinsic base region to be increased without increasing transit time in the intrinsic region.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
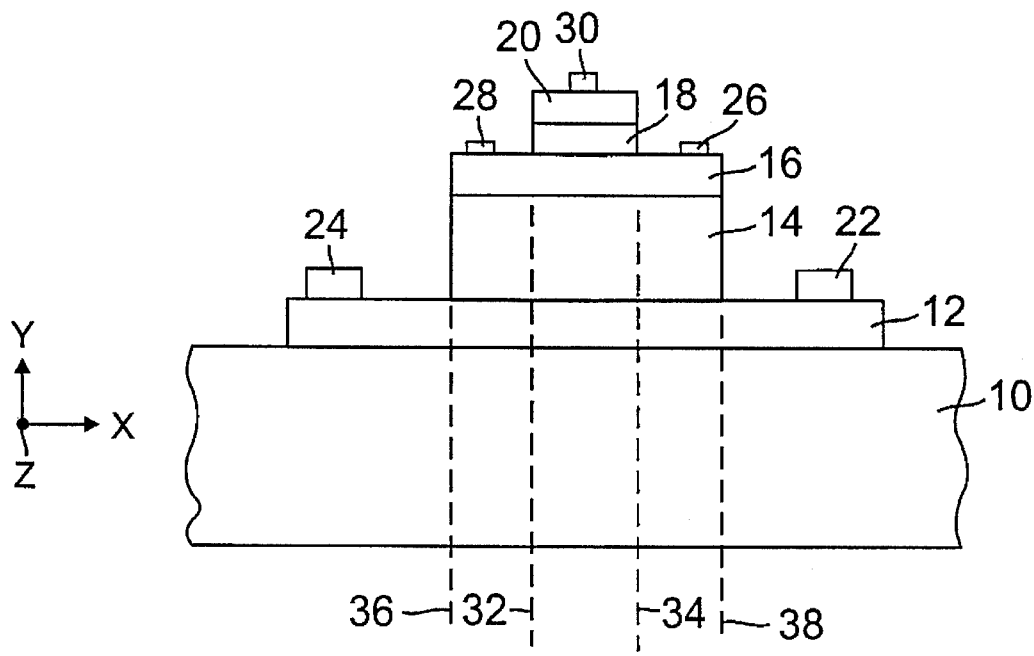
FIG. 1 is a cross-sectional depiction of a conventional DHBT device.

A conventional DHBT device is represented in FIG. 1. In accordance with a standard IC batch-fabrication sequence, the depicted device, as well as a multiplicity of other identical devices (not shown), are formed on the planar top surface of a substrate 10 that comprises a semiconductor wafer.

By way of example, the substrate 10 (FIG. 1) on which the depicted conventional DHBT device is fabricated comprises indium phosphide (InP) and is designed to be semi-insulating An $n^+$-type layer 12 made, for example, of indium gallium arsenide (InGaAs) deposited on the top surface of the substrate 10 serves as a so-called subcollector or collector-contact layer of the indicated device. Further, a multi-layer region 14 comprising, illustratively, a quartenary layer of $n^-$-type indium gallium arsenic phosphide (InGaAsP) sandwiched between a lower layer of $n^-$-type InP and an upper $n^-$-type layer of InGaAs functions as a collector in the depicted device. Such a conventional composite collector exhibits advantageous voltage-breakdown characteristics, as is well known in the art.

Additionally, the standard DHBT device of FIG. 1 includes a layer 16 made, for example, of $p^+$-type InGaAs. The layer 16 constitutes the base layer of the depicted device. Also, an n-type layer 18 made of InP serves as the emitter of the structure. And an $n^+$-type layer 20 made of InGaAs constitutes an emitter-contact layer for the device.

Further, as indicated in FIG. 1, collector contacts 22 and 24, base contacts 26 and 28, and an emitter contact 30, all made of metal, are respectively defined on the top surfaces of the subcollector layer 12, the base layer 16 and the emitter-contact layer 20. In turn, lithographically defined electrical leads (not shown) are designed to be connected to these metal contacts, thereby to electrically connect the collector, base and emitter of the indicated device to associated circuitry, in a standard manner known in the art.

Transistor action in the DHBT device shown in FIG. 1 is primarily confined to its so-called intrinsic region. In a typical such device, this vertically extending region lies between the dash reference lines 32 and 34 of FIG. 1 and has a lateral or X-direction extent of, for example, about 2.0 micrometers (μm).

To minimize base-collector capacitance in a DHBT device of the type shown in FIG. 1, the lateral extents of the base layer 16 and of the collector region 14 should be limited. In other words, the lateral or extrinsic extents of the layer 16 and of the region 14 that lie to the left of the reference line 32 (between the line 32 and line 36) and to the right of the reference line 34 (between the line 34 and line 38) should be reduced. But simple size reduction in the width of these extrinsic regions in an attempt to decrease base-collector capacitance also of course causes the base-contact area to be reduced. In turn, as mentioned earlier above, this increases the base resistance and thereby degrades important operating characteristics of the device.

Thus, conventional DHBT devices as heretofore proposed include extrinsic regions each of whose lateral extents is often in practice comparable in width to the X-direction width of the priorly defined intrinsic regions. In the particular illustrative case in which the intrinsic region of the FIG. 1 device is about 2.0 µm wide, each of the extrinsic regions of the device has a width of, for example, approximately 2.5 µm. In such a conventional structure, a practical minimum-size area to which to make base contacts is realized and, at the same time, a device characterized by relatively low base-collector capacitance and relatively low base resistance is achieved.

In accordance with the principles of the present invention, the base-collector capacitance of a standard DHBT device of the type represented in FIG. 1 is further reduced without increasing its base resistance or deleteriously affecting carrier transit time in the intrinsic region of the device. As described in detail below, this advantageous further reduction in base-collector capacitance is realized by structurally modifying a FIG. 1-type device in several unique and inventive ways. As a result, the modified device exhibits advantageous high-speed operating characteristics.

Figure 2:
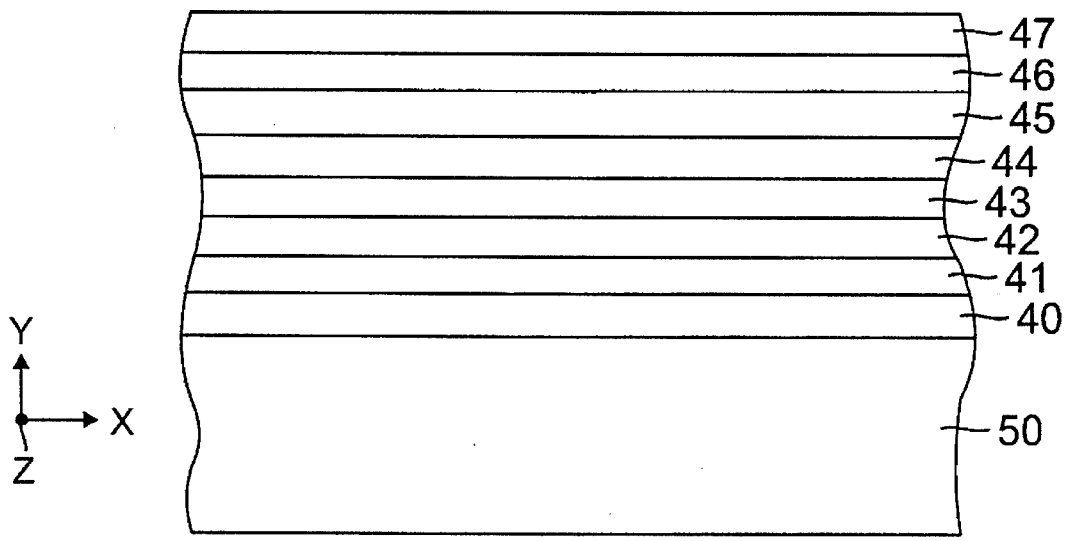
FIGS. 2 through 12 represent in cross-section the manner in which a multi-layer structure is processed to make a specific illustrative DHBT device that embodies the principles of the present invention.

The fabrication of a specific illustrative DHBT device that embodies the principles of the present invention commences by successively depositing layers 40 through 47 on the top planar surface of a substrate 50, as indicated in FIG. 2. By way of example, the substrate 50 comprises a conventional wafer of semi-insulating monocrystalline InP. Illustratively, the thickness or Y-direction extent of the substrate 50 is about 500 µm and its diameter is approximately 12.7 centimeters (cm). Moreover, the substrate 50 is grown such that its (100) crystal axis is parallel to the Y axis depicted in FIG. 2.

Illustratively, the layers 40 through 47 shown in FIG. 2 comprise compound-semiconductor layers that are successively formed on or overlying the top surface of the substrate 50. By way of example, the layers 40 through 47 are formed in a conventional metal-organic-vapor-phase-epitaxy (MOVPE) deposition sequence. Subsequently, as will be described in detail later below, the layers 40 through 47 are processed to form multiple identical DHBT devices that embody the principles of the present invention. So as not to unduly complicate the drawing, only one such specific illustrative device will be explicitly shown and described herein.

In the DHBT device to be described, the layers 40 and 41 of FIG. 2 will be lithographically patterned to form a composite subcollector. Similarly, the layers 42 through 44 will be patterned to form a composite collector. Further, a base will be formed from the layer 45, an emitter will be formed from the layer 46, and an emitter contact will be formed from the layer 47. As described later below, an emitter metal contact will subsequently be formed overlying the layer 47.

By way of a specific illustrative example, the epitaxial subcollector layer 40 shown in FIG. 2 comprises a 600-nanometer (nm)-thick layer of $n^+$-type InGaAs (silicon-doped, for example, to a level of about $7 \times 10^{18}$ $cm^{-3}$). The epitaxial subcollector layer 41 comprises $n^+$-type InP about 500 nm thick. The epitaxial collector layer 42 comprises $n^-$-type InP about 200 nm thick. The epitaxial collector layer 43 comprises $n^-$-type InGaAsP approximately 20 nm thick. Illustratively, the quartenary layer 43 is characterized by energy bandgap and wavelength properties of 0.99 electron volts and 1.25 µm, respectively. Further, the epitaxial collector layer 44 comprises $n^-$-type InGaAs about 40 nm thick. The epitaxial base layer 45 comprises $p^+$-type InGaAs approximately 40 nm thick (zinc-doped, for example, to a level of about $3 \times 10^{19}$ $cm^{-3}$). The epitaxial emitter layer 46 comprises n-type InP about 170 nm thick. And the epitaxial emitter-contact layer 47 comprises $n^+$-type InGaAs approximately 20 nm thick (silicon-doped, for example, to a level of about $7 \times 10^{18}$ $cm^{-3}$).

Figure 3:
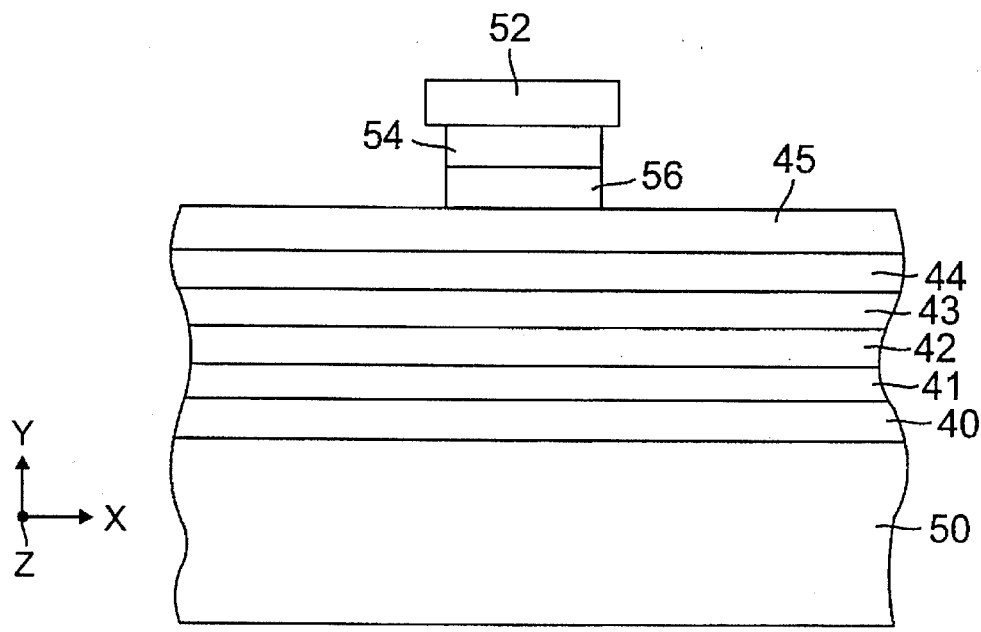

Next, utilizing standard patterning techniques, an emitter metal contact is photolithographically defined on the emitter contact layer 47. The resulting metal contact is shown in FIG. 3 where it is designated by reference numeral 52. In practice, the metal contact 52 actually comprises, for example, a conventional tri-layer metallization system that includes, from bottom to top, layers of titanium (Ti), platinum (Pt) and gold (Au). Illustratively, the overall thickness of such a known tri-metal contact 52 is about 150 nm.

Subsequently, by employing the metal contact 52 (FIG. 3) as a mask, the emitter-contact layer 47 and the emitter layer 46 of FIG. 2 are etched in sequence. For etching the InGaAs layer 47, a solution comprising, for example, one volume of citric acid (thirty grams of anhydrous citric acid crystals dissolved in 100 grams of water) to one volume of hydrogen peroxide is effective. The InP layer 46 is substantially untouched by such an etching solution. Thereafter, the layer 46 is etched by a solution that comprises, for example, one volume of hydrochloric acid to one volume of phosphoric acid. Layers of InGaAs in the structure are substantially untouched by this second-specified etching solution.

At that point in the fabrication sequence, the structure includes an emitter contact 54 and an emitter 56, as indicated in FIG. 3, respectively patterned from the layers 47 and 46 of FIG. 2. Due to the isotropic nature of the aforedescribed wet-etching steps, these elements 54 and 56, which underlie the metal contact 52, have a width or X-direction extent that is approximately 190 nm less than the width of the masking element 52, as represented in FIG. 3. The resulting undercut characteristic of the elements 54 and 56 serves an important purpose in a subsequent metal-deposition step, as described below.

Next, in a standard processing sequence, a layer of photoresist is deposited on the entire top surface of the FIG. 3 structure. The photoresist layer is then patterned in a conventional way, whereby only photoresist elements 58 and 60 are left remaining on the top of the structure, as depicted in FIG. 4.

Subsequently, a layer of metal is deposited on the entire top surface of the structure that includes the photoresist elements 58 and 60. Illustratively, the deposited metal layer comprises a conventional tri-layer metallization system that includes, from bottom to top, layers of Ti, Pt and Au. As shown in FIG. 4, the metal layer comprises deposited elements 61 through 65. In practice, the thickness of the elements 61 through 65 is controlled to be less than the combined thickness of the elements 54 and 56, thereby to avoid electrical contact between the metal element 52 and the metal elements 62 and 64. For the illustrative case in which the combined thickness of the elements 54 and 56 is approximately 190 nm, the thickness of the deposited metal layer including the elements 62 and 64 is thus, for example, chosen to be about 100 nm.

Also, due to the undercut nature of the elements 54 and 56 (FIG. 4), the metal elements 62 and 64 as deposited are offset from the sides of the elements 54 and 56, thereby avoiding electrical contact therewith. As is evident from FIG. 4, the amount of this offset is determined by the lateral extent of the overhang of the element 52 relative to the underlying elements 54 and 56.

Figure 4:
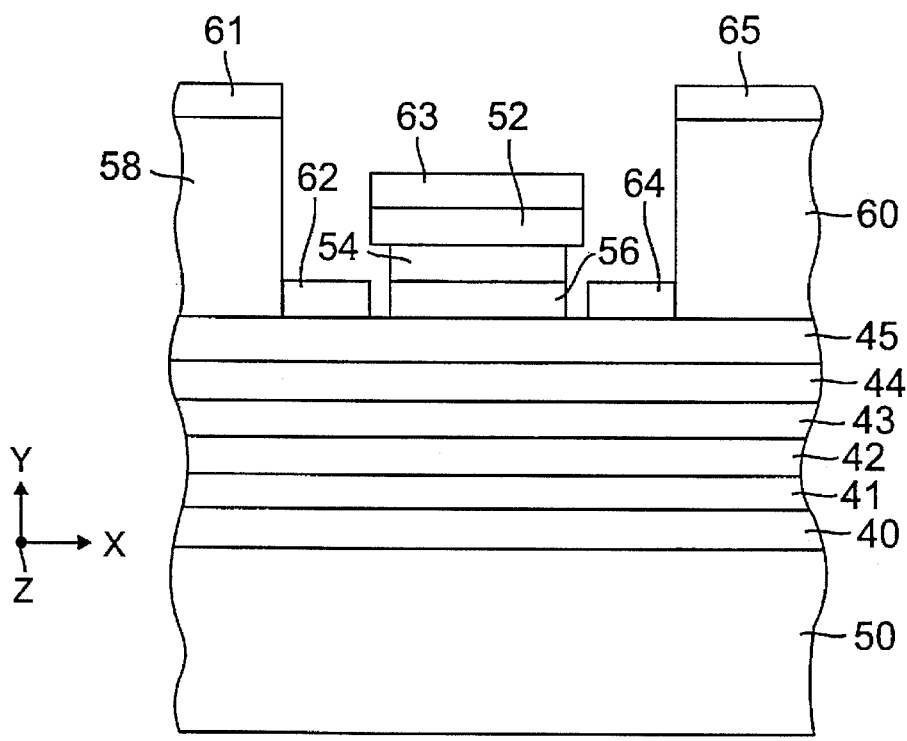

In a conventional lift-off step, the photoresist elements 58 and 60 of FIG. 4 are then removed from the depicted structure by dissolving them in a standard solvent. Such dissolution of the elements 58 and 60 also removes from the structure the respective overlying metal elements 61 and 65, whereby only the metal elements 62 through 64 then remain on the structure.

Figure 5:
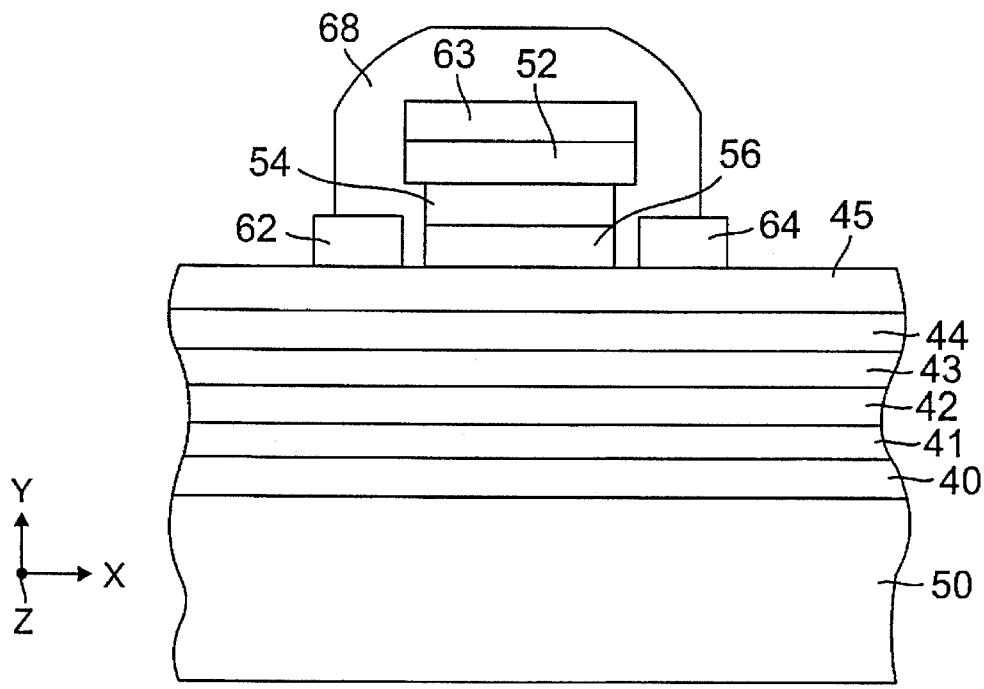

A blanket layer of photoresist is then deposited on the entire top surface of the structure. This layer is subsequently lithographically patterned to form a mask over each device being fabricated on the substrate 50. One such photoresist mask element 68 is shown in FIG. 5.

Figure 6:
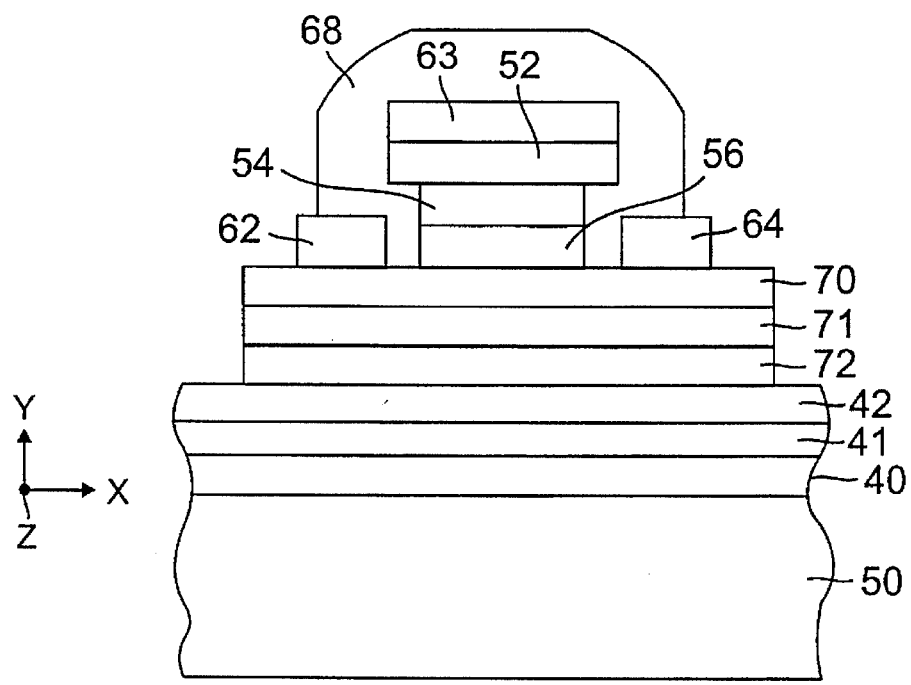

Etching of the base layer 45 and of the upper two collector layers 43 and 44 is then carried out. Illustratively, this is done in a wet-etching step utilizing the aforespecified citric acid/hydrogen peroxide solution. The underlying layer 42 made of InP is left substantially intact during this etching step. At that point in the fabrication sequence, the structure appears as indicated in FIG. 6 where the remaining portions of the etched layers 43 through 45 are designated, respectively, by reference numerals 70 through 72. Importantly, to achieve a necessary undercut in a subsequent etching step, the edges of the remaining portions 70 through 72 are established parallel to the (001) or (010) crystal direction. In other words, the planar right-hand and left-hand faces of the portions 70 through 72, which respectively lie in parallel Y–Z planes, are established parallel to a (001) or (010) crystal direction of the substrate 50.

In a subsequent wet-etching step, utilizing the aforementioned hydrochloric acid/phosphoric acid solution, the InP layers 41 and 42 shown in FIG. 6 are etched, with the photoresist element 68 and the metal elements 62 and 64 continuing to serve as an etch-mask. As a result, and in accordance with a feature of the present invention, the bottom collector layer 42 and the top subcollector layer 41 are thereby purposely undercut relative to the previously mentioned overlying portions 70 through 72. During this etching step, the bottom subcollector layer 40 made of InGaAs remains substantially intact.

Figure 7:
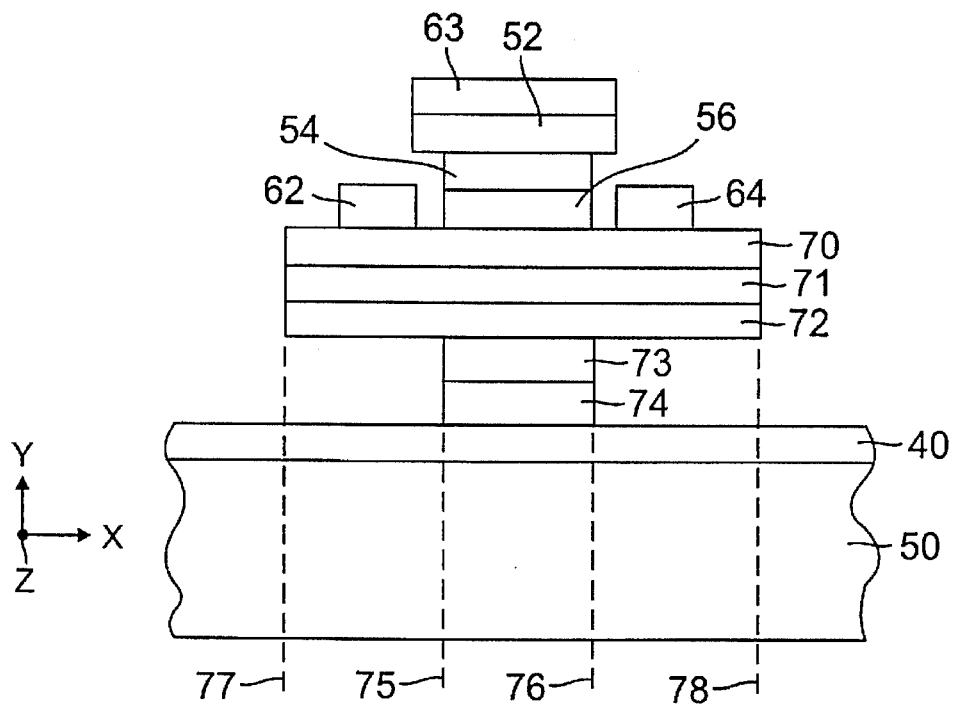

After the aforespecified etching and after removal of the photoresist element 68, the structure being fabricated then appears as shown in FIG. 7, where reference numerals 73 and 74 depict, respectively, the remaining portions of the etched bottom collector layer 42 and the etched top subcollector layer 41. Illustratively, the etching of the layers 41 and 42 is controlled such that the left-hand faces of the portions 73 and 74 and the left-hand faces of the elements 54 and 56 lie approximately in the same Y–Z plane, and such that the right-hand faces of the portions 73 and 74 and the right-hand faces of the elements 54 and 56 also lie approximately in the same Y–Z plane. The intrinsic region of the resulting DHBT device structure is thus defined as lying between reference dash lines 75 and 76 of FIG. 7. Further, the left- and right-hand extrinsic regions of the structure extend, respectively, approximately between the line 75 and reference line 77, and between the line 76 and reference line 78. In one specific illustrative embodiment, the lateral extent of each of the indicated extrinsic regions is about 1.0-to-1.5 μm. In such a structure, fabrication of relatively low-resistance base contacts is feasible.

Significantly, because of the unique undercut structure described above and represented in FIG. 7, the effective Y-direction extent of the intrinsic region of the resulting device (that is, the distance from the base portion 70 to the subcollector portion 74) can be thereby designed to be considerably less (by the thickness of the subcollector portion 74) than the Y-direction extent of each of the indicated extrinsic regions of the device. The thickness of the intrinsic region can be thereby designed to exhibit a relatively short carrier transit time. Concurrently, the thickness and thus the base-collector capacitance of the extrinsic regions can be established at an advantageous relatively low value.

Figure 8:
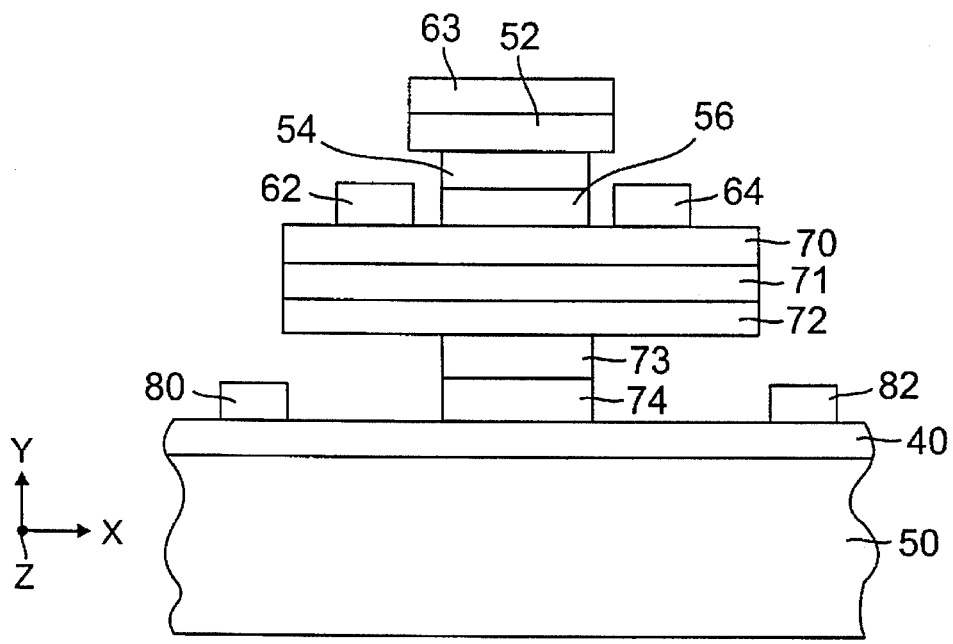

Subsequently, as indicated in FIG. 8, collector metal contacts are formed. Illustratively, this is done by conventional photolithographic and lift-off techniques utilizing, for example, the aforedescribed tri-layer metallization system comprising Ti, Pt and Au. The thickness of the contacts 80 and 82 is, for instance, about 150-to-200 nm.

The conductive $n^+$-type subcollector layer 40 of FIG. 8 is then selectively etched to electrically isolate from each other the multiple DHBT devices being fabricated on the substrate 50. This is done, for example, by defining a photoresist mask element covering each individual device structure, as illustratively depicted in FIG. 9. Reference numeral 84 designates one such mask element.

Figure 9:
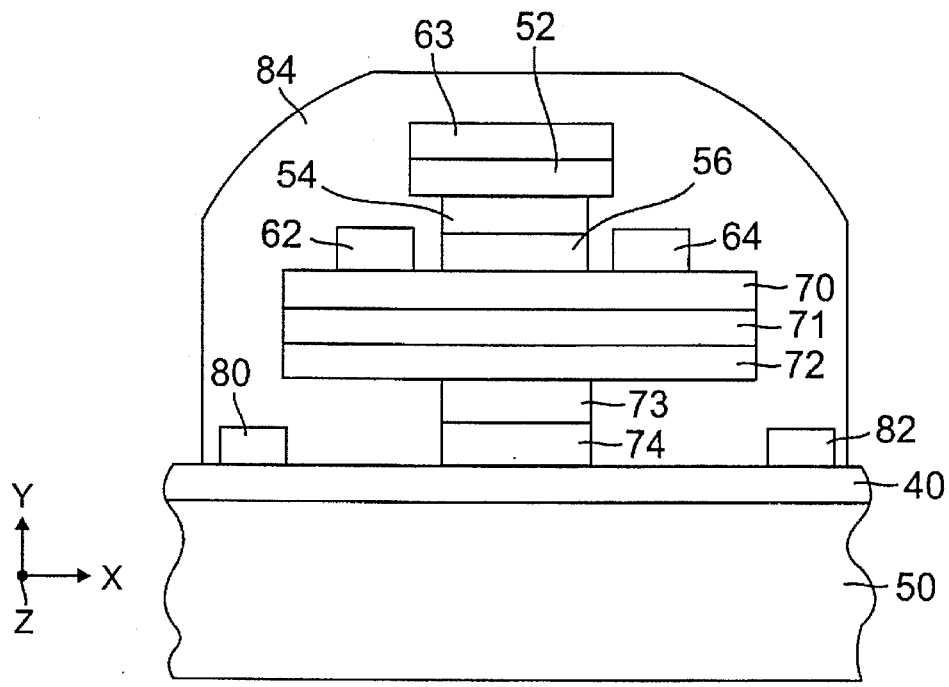
Figure 10:
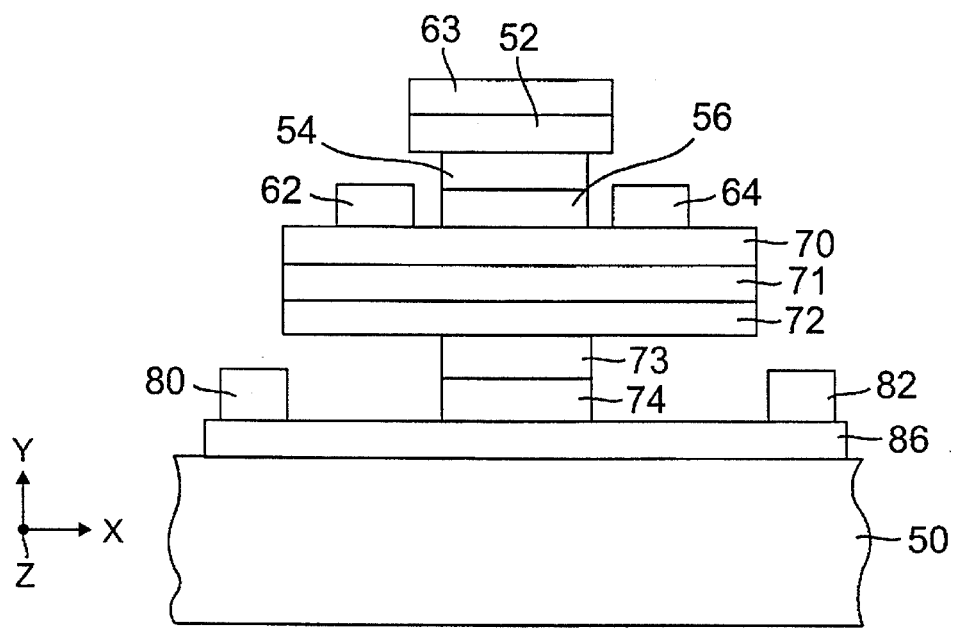

Etching of unprotected portions of the InGaAs layer 40 of FIG. 9 is then carried out utilizing, for instance, the aforespecified citric acid/hydrogen peroxide solution. Subsequently, the photoresist element 84 is removed. At that point, multiple electrically isolated devices exist on the substrate 50. One such device is represented in FIG. 10, where the portion of the etched layer 40 that remains as an integral part of the depicted device is designated by reference numeral 86.

Figure 11:
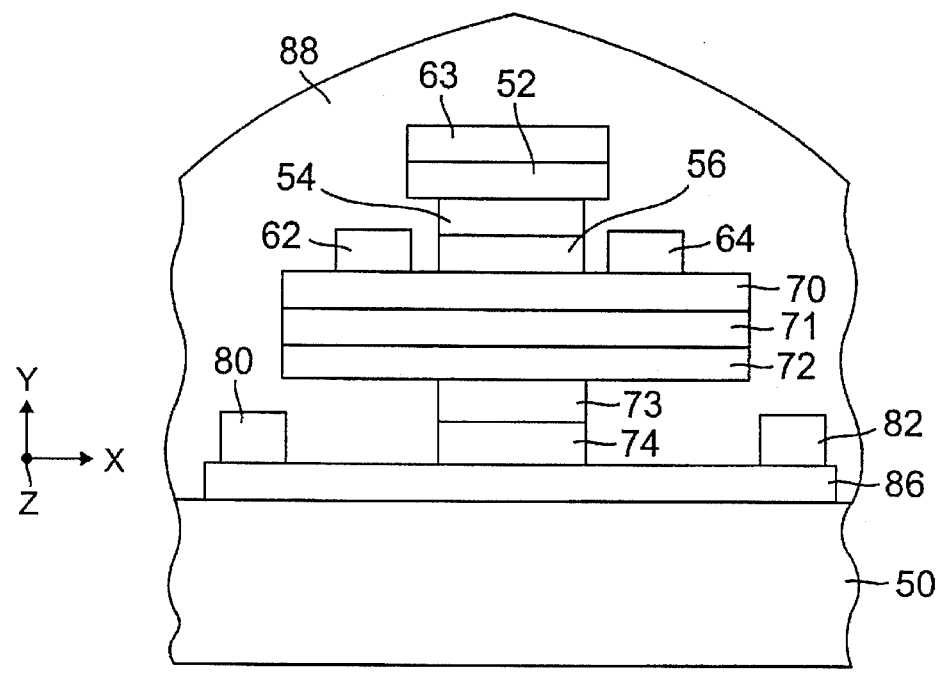

Next, in accordance with the principles of the present invention, the entire wafer or substrate 50 (FIG. 10) is covered with a layer of a flowable material whose dielectric constant is low relative to that of the InP layer 73. Illustratively, a standard polyimide material (whose dielectric constant is approximately 4.0 compared to about 12.0 for InP) is spin-coated in liquid form onto the top of the substrate 50 to form a layer about 2-to-3 μm thick, as indicated in FIG. 11 where the layer made of polyimide material is designated by reference numeral 88. During this coating step, the polyimide material flows to fill in the entirety of the volume caused by the above-specified removal of semiconductor material in the extrinsic regions underlying the overhanging portions of the layers 70 through 72.

Curing of the layer 88 (FIG. 11) made of polyimide material is then carried out. To avoid cracking of the material, such curing is advantageously done in steps. Thus, for example, the device including the layer 88 is first heated ten minutes at approximately 90 degrees Celsius, then for about twenty minutes at approximately 150 degrees Celsius and, finally, for about two hours at approximately 250 degrees Celsius. The resulting hardened polyimide material becomes an integral part of the final structure. Importantly, the hardened material imparts structural robustness to the device and also effectively passivates it.

Figure 12:
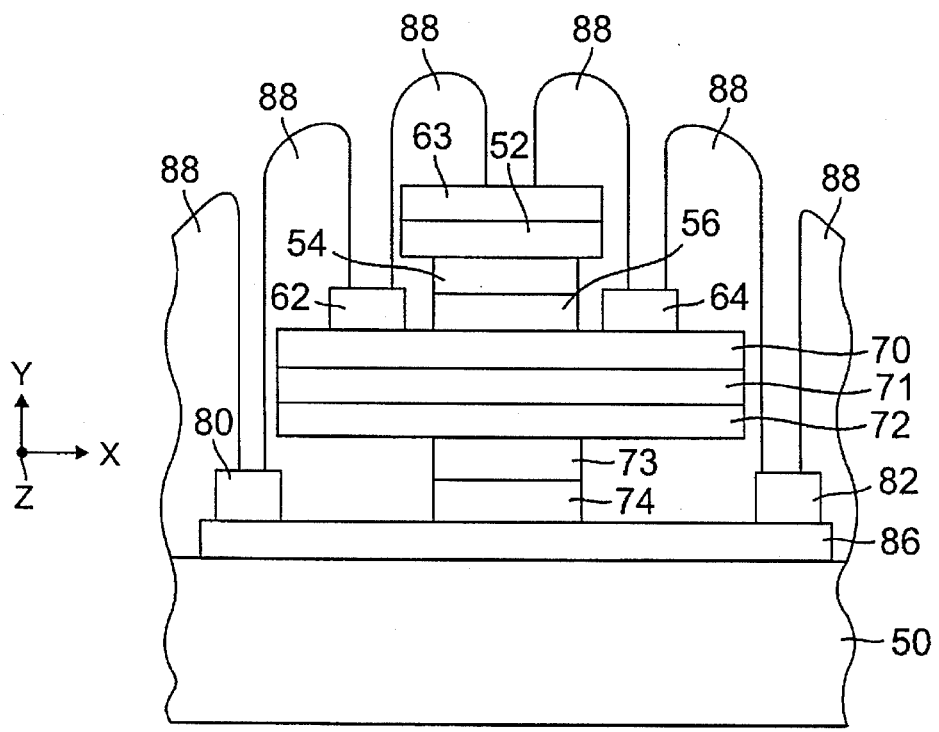

Subsequently, by utilizing standard photolithographic and plasma etching techniques, openings are established in the polyimide layer 88 in registry with the aforedescribed metal contacts 62 through 64, 80 and 82, as represented in FIG. 12.

In a manner well known in the art, conductive interconnect lines (not shown) are then defined on the surface of the layer 88, and extending into the indicated openings, to establish electrical connections between the metal contacts of the device and conventional associated external contact pads (not shown).

In accordance with the invention, a significant reduction in the base-collector capacitance of a DHBT device is achieved. This reduction stems from the fact that in the extrinsic regions a relatively low-dielectric-constant material (for example, polyimide) is substituted for a relatively high-dielectric-constant material (for example, InP) and, moreover, from the fact that the base-collector distance in the extrinsic regions is established to be greater than the corresponding effective distance in the intrinsic region of the device.

Assume, for example, that the dielectric constant of a typical polyimide material is about 4.0 and that the dielectric constant of $n^-$-type InP is approximately 12.0. Further, assume that the thickness of the polyimide material in the extrinsic regions of the particular illustrative device described herein is about 700 nm, that the thickness of the $n^-$-type element 73 is approximately 200 nm and that the thickness of the $n^+$-type element 74 is thus about 500 nm. For such values, the base-collector capacitance in the extrinsic regions of the specific illustrative DHBT device shown in FIG. 12 is about one-tenth that of a conventional such device in which $n^-$-type semiconductor material such as InP exists in the extrinsic regions. As a result, a significant increase in the unity current-gain cutoff frequency and in the maximum oscillation frequency of a DHBT device is realized.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. A double-heterostructure bipolar device having vertically extending intrinsic and extrinsic portions, said device comprising multiple compound-semiconductor layers on a substrate, said layers comprising in order, from top to bottom, emitter-contact, emitter, base, collector and subcollector regions, each of said collector and subcollector regions, comprising plural layers, the bottom layer of said collector region and the top layer of said subcollector region each having a lateral extent which is approximately the same as the lateral extent of said emitter-contact and emitter regions and narrower than the lateral extents of said base region and the other layers of said collector and subcollector regions, the lateral extents of said emitter and emitter-contact regions, of said bottom collector layer and of said top subcollector layer being definitive of the lateral extent of the intrinsic portion of said device, and the lateral extents of said base region and of the other layers of said collector region on either side of said intrinsic portion being definitive of the lateral extent of the extrinsic portions of said device, and a material disposed adjacent the sides of said bottom collector layer and of said top subcollector layer in said extrinsic portions of said device, said material being characterized by a dielectric constant that is less than the dielectric constant of the semiconductor material from which said bottom collector layer is made, wherein said relatively-low-dielectric-constant material comprises polyimide material, wherein said polyimide material covers substantially the entirety of the surfaces of said semiconductor layers, wherein said polyimide material includes openings therethrough, and further including means extending through said openings for making electrical connections to said emitter-contact, base and bottom subcollector layers, and wherein said bottom collector layer and said top subcollector layer each comprise indium phosphide, and wherein said bottom subcollector layer comprises indium gallium arsenide.

2. A device as in claim 1 wherein said top subcollector layer comprises $n^+$-type indium phosphide.

3. A device as in claim 2 wherein said collector region also includes a layer of $n^-$-type indium gallium arsenic phosphide.

4. A device as in claim 3 wherein said base layer comprises $p^+$-type indium gallium phosphide, said emitter layer comprises n-type indium phosphide, and said emitter-contact layer comprises $n^+$-type indium gallium arsenide.

5. A device as in claim 4 wherein the vertical extent of said top subcollector layer is at least twice that of said bottom collector layer.

\* \* \* \* \*